United States Patent
Buehlmann

(10) Patent No.: US 7,449,346 B2
(45) Date of Patent: Nov. 11, 2008

(54) METHOD OF MANUFACTURING FERROELECTRIC THIN FILM FOR DATA STORAGE AND METHOD OF MANUFACTURING FERROELECTRIC RECORDING MEDIUM USING THE SAME METHOD

(75) Inventor: Simon Buehlmann, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 36 days.

(21) Appl. No.: 11/517,303

(22) Filed: Sep. 8, 2006

(65) Prior Publication Data

US 2007/0254383 A1 Nov. 1, 2007

(30) Foreign Application Priority Data

Apr. 28, 2006 (KR) .................. 10-2006-0038881

(51) Int. Cl.
*H01L 21/00* (2006.01)
(52) U.S. Cl. .................. 438/3; 438/240; 438/785; 257/E29.272; 257/E21.208; 257/E21.436; 257/E21.663
(58) Field of Classification Search ................. 438/3, 438/240, 785; 257/E29.272, E21.208, E21.436, 257/E21.663
See application file for complete search history.

(56) References Cited

U.S. PATENT DOCUMENTS

| 6,146,905 | A | * | 11/2000 | Chivukula et al. | ............. 438/3 |
| 6,844,261 | B2 | * | 1/2005 | Marsh et al. | ............. 438/681 |
| 2002/0146915 | A1 | * | 10/2002 | Narwankar et al. | ......... 438/785 |
| 2003/0080325 | A1 | * | 5/2003 | Uchiyama et al. | ........... 252/500 |
| 2005/0230727 | A1 | * | 10/2005 | Tamura et al. | .............. 257/295 |

* cited by examiner

*Primary Examiner*—Michelle Estrada
(74) *Attorney, Agent, or Firm*—Sughrue Mion, PLLC

(57) ABSTRACT

A method of manufacturing a ferroelectric thin film with good crystallinity and improved surface roughness includes: forming on a substrate a metal nitride-based precursor layer containing one selected from the group consisting of TiN, $Zr_xTi_{(1-x)}N$ (0<x<1), FeN, and NbN; forming on the metal nitride-based precursor layer a mixed gas atmosphere containing oxygen ($O_2$) and one reactive gas selected from the group consisting of PbO(g), $Bi_2O_3$(g), and $K_2O$(g); annealing the metal nitride-based precursor layer in the mixed gas atmosphere and forming a ferroelectric thin film containing one selected from the group consisting of $PbTiO_3$, $PbZr_xTi_{(1-x)}O_3$ (0<x<1), $Bi_2Ti_2O_7$, $Bi_4Ti_3O_{12}$, $BiFeO_3$, and $KNbO_3$.

23 Claims, 9 Drawing Sheets

METHOD OF MANUFACTURING FERROELECTRIC THIN FILM FOR DATA STORAGE AND METHOD OF MANUFACTURING FERROELECTRIC RECORDING MEDIUM USING THE SAME METHOD

CROSS-REFERENCE TO RELATED PATENT APPLICATION

This application claims the benefit of Korean Patent Application No. 10-2006-0038881, filed on Apr. 28, 2006, in the Korean Intellectual Property Office, the disclosure of which is incorporated herein in its entirety by reference.

BACKGROUND OF THE INVENTION

1. Field of the Invention

Methods consistent with the present invention relate to manufacturing a ferroelectric thin film for data storage, and more particularly, to a method of manufacturing a ferroelectric thin film with good crystallinity and improved surface roughness.

2. Description of the Related Art

With the recent advances of data storage technology, the recording density of data storage devices, such as hard disks or optical disks, has increased to 1 Gbit/inch$^2$ or more. The rapid development of digital technology is requiring even higher capacity data storage devices. However, as for the conventional data storage devices, the maximum recording density is limited due to superparamagnetic limits or laser diffraction limits. Research has recently been carried out into the development of data storage devices with a density over 100 Gbit/inch$^2$ which overcome the diffraction limit using near-field optics.

On the other hand, research has been carried out into the development of high capacity data storage devices using tip-shaped probes as can be found in atomic force microscopy (AFM). Since tip-shaped probes can be downsized to several nanometers, atomic level surface microstructure can be observed using such tips. Theoretically, terabit data storage devices can be made using tip-shaped probe recording. Recording media and recording methods are important factors determining the performance of tip-shaped probe based data storage devices. Among the media, a ferroelectric recording medium stands out and thus has been subject to study.

FIG. 1 is a cross-sectional view of a conventional ferroelectric recording medium.

Referring to FIG. 1, a bottom electrode 4 and a recording medium layer 8 are sequentially stacked on a substrate 2. The recording medium layer 8 is made of a ferroelectric thin film such as a PbTiO$_3$ thin film, a PbZr$_x$Ti$_{(1-x)}$O$_3$ (PZT) thin film, or a SrBi$_2$Ta$_2$O$_9$ (SBT) thin film. When a voltage pulse is applied between the bottom electrode 4 and an AFM tip 9, the polarization of the ferroelectric media can be locally changed. Depending on the sign of the voltage, up or down polarization can be written. The read-out of the polarization state can for example be detected using a resistive probe. For more information on the structure and operation of the ferroelectric recording medium, refer to Korean Patent Registration No. 0379415.

The recording medium, using the ferroelectric thin film has advantages of high data writing speed, low power consumption, and data rewriting. However, the recording medium using the ferroelectric thin film has a disadvantage of short data retention time. Also, since the ferroelectric thin film is polycrystalline, it has poor surface roughness due to grain boundaries. Due to the poor surface roughness, it takes a long time to adjust a distance between the AFM tip 9 and the recording medium layer 8, thereby lowering data reading and writing speeds and wearing out the AFM tip 9.

SUMMARY OF THE INVENTION

An aspect of the present invention provides a method of manufacturing a ferroelectric thin film with good crystallinity and improved surface roughness.

According to an aspect of the present invention, there is provided a method of manufacturing a ferroelectric thin film, the method comprising: forming on a substrate a metal nitride-based precursor layer containing one selected from the group consisting of TiN, Zr$_x$Ti$_{(1-x)}$N (0<x<1), FeN, and NbN; forming on the metal nitride-based precursor layer a mixed gas atmosphere containing oxygen (O$_2$) and one reactive gas selected from the group consisting of PbO(g), Bi$_2$O$_3$(g), and K$_2$O(g); and transforming the metal nitride-based precursor layer in the mixed gas atmosphere into a ferroelectric thin film containing one selected from the group consisting of PbTiO$_3$, PbZr$_x$Ti$_{(1-x)}$O$_3$ (0<x<1), Bi$_2$Ti$_2$O$_7$, Bi$_4$Ti$_3$O$_{12}$, BiFeO$_3$, and KNbO$_3$.

The forming of the metal nitride-based precursor layer may comprise doping the metal nitride-based precursor layer with at least one element selected from the group consisting of Zr, Nb, and V. The metal nitride-based precursor layer may be formed to a thickness of 2 μm or less. The metal nitride-based precursor layer may be annealed at a temperature of 400 to 800° C. The metal nitride-based precursor layer may be annealed at a temperature of 650° C.

According to another aspect of the present invention, there is provided a method of manufacturing a ferroelectric recording medium, the method comprising: forming a conductive electrode layer on a substrate; forming on the electrode layer a metal nitride-based precursor layer containing one selected from the group consisting of TiN, Zr$_x$Ti$_{(1-x)}$N (0<x<1), FeN, and NbN; forming on the metal nitride-based precursor layer a mixed gas atmosphere containing oxygen (O$_2$) and one reactive gas selected from the group consisting of PbO(g), Bi$_2$O$_3$(g), and K$_2$O(g); and transforming the metal nitride-based precursor layer in the mixed gas atmosphere into a ferroelectric thin film containing one selected from the group consisting of PbTiO$_3$, PbZr$_x$Ti$_{(1-x)}$O$_3$ (0<x<1), Bi$_2$Ti$_2$O$_7$, Bi$_4$Ti$_3$O$_{12}$, BiFeO$_3$, and KNbO$_3$.

According to still another aspect of the present invention, there is provided a method of manufacturing a ferroelectric recording medium, the method comprising: forming on a substrate a metal nitride-based precursor layer containing one selected from the group consisting of TiN, Zr$_x$Ti$_{(1-x)}$N (0<x<1), FeN, and NbN; forming on the metal nitride-based precursor layer a mixed gas atmosphere containing oxygen (O$_2$) and one reactive gas selected from the group consisting of PbO(g), Bi$_2$O$_3$(g), and K$_2$O(g); and heating the metal nitride-based precursor layer in the mixed gas atmosphere and forming on a surface layer of the annealed metal nitride-based precursor layer a ferroelectric thin film containing one selected from the group consisting of PbTiO$_3$, PbZr$_x$Ti$_{(1-x)}$O$_3$ (0<x<1), Bi$_2$Ti$_2$O$_7$, Bi$_4$Ti$_3$O$_{12}$, BiFeO$_3$, and KNbO$_3$.

Accordingly, the ferroelectric thin film with good crystallinity and improved surface roughness can be manufactured using the method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
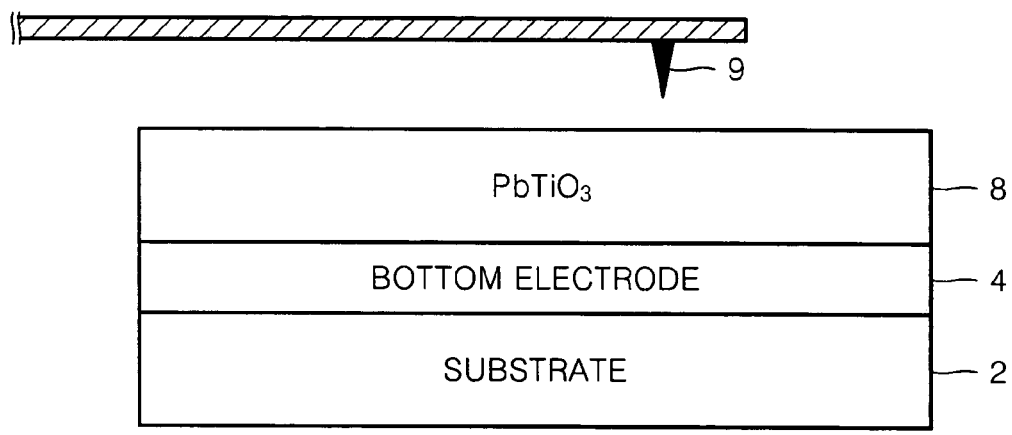
FIG. 1 is a cross-sectional view of a conventional ferroelectric recording medium.

The present invention will now be described more fully with reference to the accompanying drawings, in which exemplary embodiments of the invention are shown. The thicknesses of layers or regions in the drawings are exaggerated for clarity.

Figure 2A:
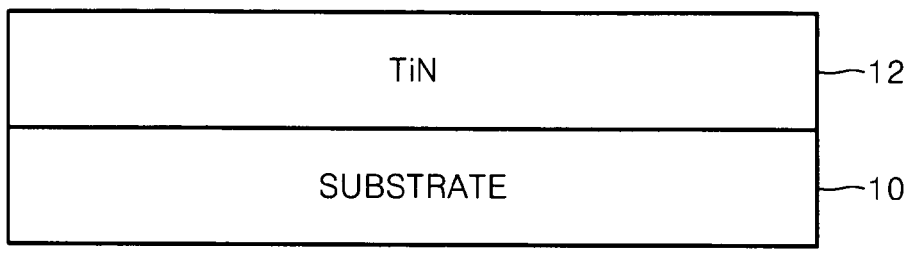
FIGS. 2A through 2C are cross-sectional views illustrating a method of manufacturing a ferroelectric thin film according to an exemplary embodiment of the present invention.
Figure 2B:
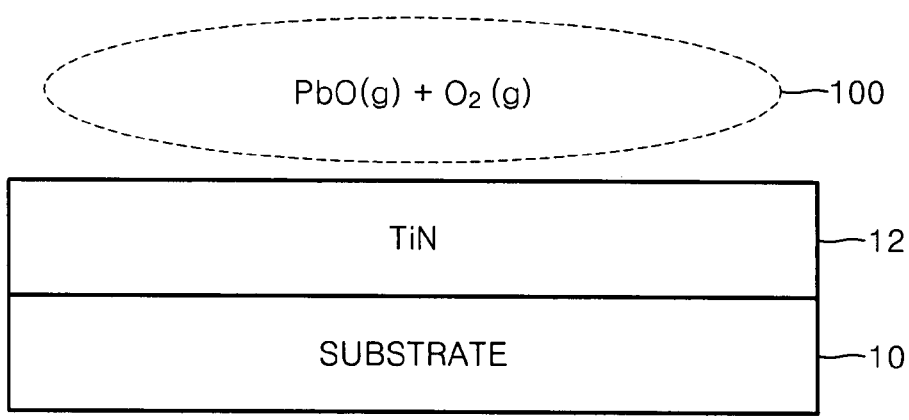
Figure 2C:
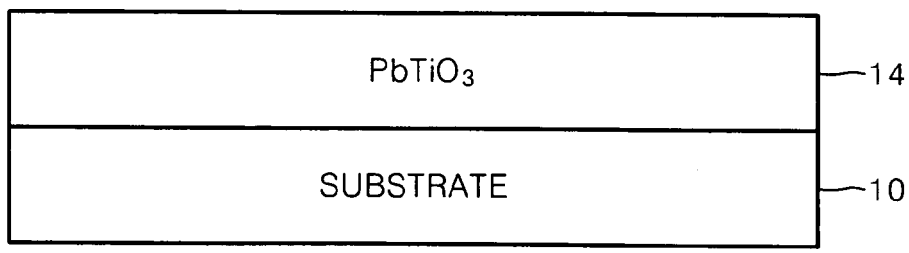

FIGS. 2A through 2C are cross-sectional views illustrating a method of manufacturing a ferroelectric thin film according to an exemplary embodiment of the present invention.

Referring to FIG. 2A, a metal nitride-based precursor layer 12 containing TiN is formed on a substrate 10. The substrate 10 may be a quartz substrate, an MgO single crystal substrate, a silicon single crystal substrate, or another substrate.

The TiN-based precursor layer 12 may be formed by vapor deposition such as sputtering, metalorganic chemical vapor deposition (MOCVD), plasma enhanced metalorganic chemical vapor deposition (PEMOCVD), or atomic layer deposition (ALD). In the present exemplary embodiment, the TiN-based precursor layer 12 was formed by sputtering. In detail, a 95 Watt DC power was applied to a Ti target with a diameter of 3 inches to produce a voltage of −473 V and allow a current of 0.2 A to flow through the Ti target. The sputtering pressure was 4 mT, the $N_2$ flow rate was 50 sccm, and a substrate temperature was 400° C.

The TiN-based precursor layer 12 may be formed to a thickness of 2 μm or less. If the TiN-based precursor layer 12 is thicker than 2 μm, a $PbTiO_3$ thin film formed as a result of reaction between the TiN and PbO(g) during a subsequent annealing process may be peeled off from the substrate 10.

Referring to FIGS. 2B and 2C, a mixed gas atmosphere 10 containing PbO(g) and oxygen ($O_2$) is formed on the TiN-based precursor layer 12, and may be produced by thermal evaporation or sputtering. For example, the PbO(g) may be obtained by annealing and evaporating PbO powder. Alternatively, the PbO(g) may be easily obtained by installing a Pb target or a PbO target in a sputtering, chamber and sputtering the same in a plasma atmosphere containing oxygen ($O_2$).

Next, the TiN-based precursor layer 12 is annealed in the mixed gas atmosphere 100 containing the PbO(g) and oxygen ($O_2$) at a temperature of 400 to 800° C., preferably at a temperature of less than 650° C., thereby obtaining a ferroelectric thin film 14 containing $PbTiO_3$. The formation of the $PbTiO_3$ thin film 14 may be expressed by:

(a) $2TiN(s) + 2O_2(g) + 2PbO(g) \rightarrow 2PbTiO_3(s) + N_2(g)$.

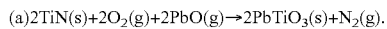

Alternatively, the formation of the $PbTiO_3$ thin film 14 may be expressed by:

(b) $2TiN(s) + 2O_2(g) \rightarrow 2TiO_2(s) + N_2(g)$

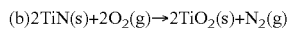

(c) $TiO_2(s) + PbO(g) \rightarrow PbTiO_3(s)$

If the annealing process is performed below 400° C., the TiN-based precursor layer 12 and the PbO(g) may not react with each other, thereby failing to form the $PbTiO_3$ thin film 14. If the annealing process is performed above 800° C., however, a volatile PbO component evaporates from a preformed $PbTiO_3$ thin film 14, thereby failing to complete the $PbTiO_3$ thin film 14, or leading to severe lead and oxygen loss in the $PbTiO_3$.

Using the ferroelectric thin film manufacturing method according to the present exemplary embodiment, a ferroelectric thin film with good crystallinity and improved surface roughness can be obtained, and also a ferroelectric thin film with a stoichiometric composition can be easily manufactured, since predetermined elements can be easily mixed and doped during the manufacture.

In detail, it has been reported in various literature that a TiN layer with good surface morphology and good crystallinity can be finished to a surface roughness of less than 1 nm. Accordingly, the ferroelectric $PbTiO_3$ thin film 14 formed using the TiN-based precursor layer 12 according to the manufacturing method of the present exemplary embodiment can have good crystallinity and improved surface roughness.

In order to improve the performance of the ferroelectric thin film 14, at least one element selected from the group consisting of Zr, Nb, and V may be doped into the TiN-based precursor layer 12. According to the present exemplary embodiment, these elements can be easily doped. Those elements can reduce leakage current from the ferroelectric $PbTiO_3$ thin film 14. For example, the elements may be doped by disposing multi-targets including an Nb target and a V target in the sputtering chamber. The respective Zr, Nb, and V may be mixed and doped with the TiN to form ZrN, NbN, and VN. Since the lattice parameters of the ZrN, NbN, and VN are respectively 4.58 Å, 4.39 Å, and 4.137 Å which are similar to the lattice parameter of the TiN (4.23 Å), the ZrN, NbN, and VN can be easily mixed and doped. As a result, the ferroelectric thin film 14 can easily have a predetermined stoichiometric composition.

Figure 3A:
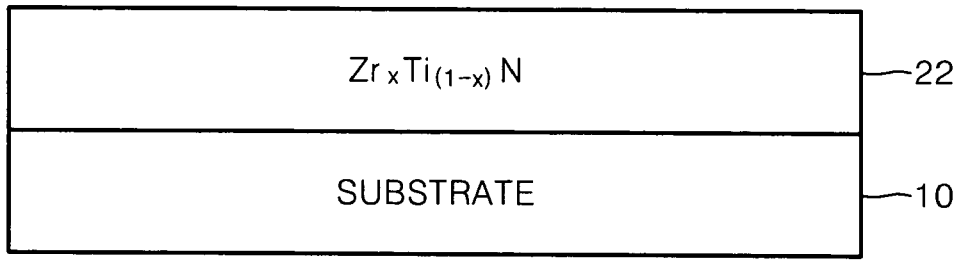
FIGS. 3A through 3C are cross-sectional views illustrating a method of manufacturing a ferroelectric thin film according to another exemplary embodiment of the present invention.
Figure 3B:
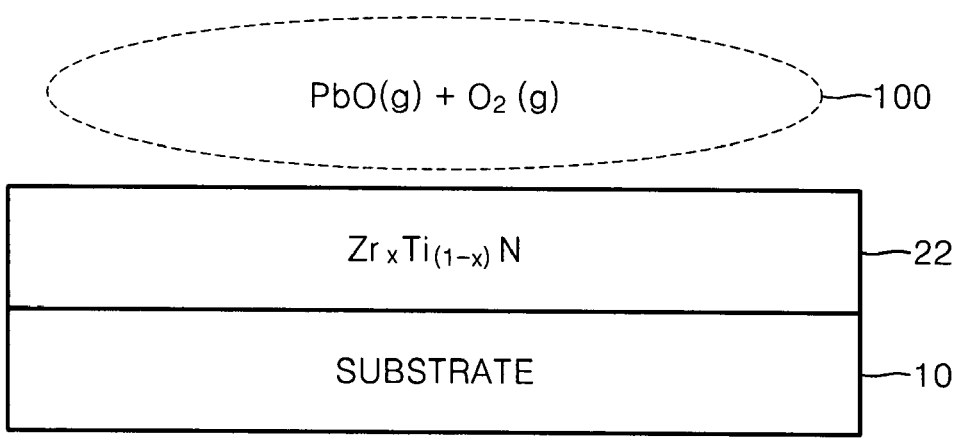
Figure 3C:
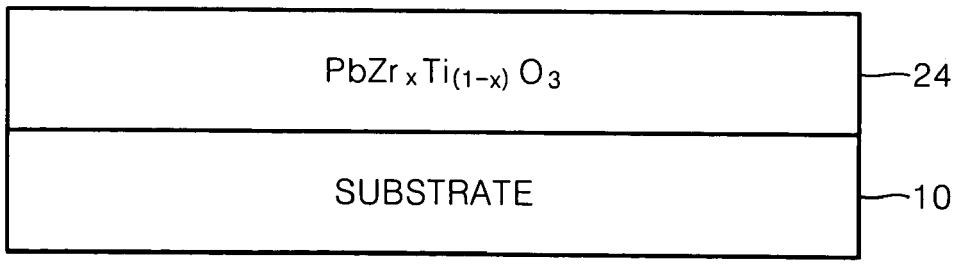

FIGS. 3A through 3C are cross-sectional views illustrating a method of manufacturing a ferroelectric thin film according to another exemplary embodiment of the present invention.

Referring to FIG. 3A, a metal nitride-based precursor layer 22 containing $Zr_xTi_{(1-x)}N$ (0<x<1) is formed on the substrate 10. The $Zr_xTi_{(1-x)}N$-based precursor layer 22 can be formed under the same conditions as in the exemplary embodiment of FIGS. 2A through 2C, except that multi-targets including a Zr target and a Ti target are installed in the sputtering chamber. The Zr and Ti may be mixed with the TiN to form ZrN and TiN. Since the lattice parameters of the ZrN and TiN are similar, respectively 4.58 Å and 4.23 Å, the ZrN and TiN can be easily mixed, and thus a predetermined stoichiometric composition can be easily achieved.

Figure 4A:
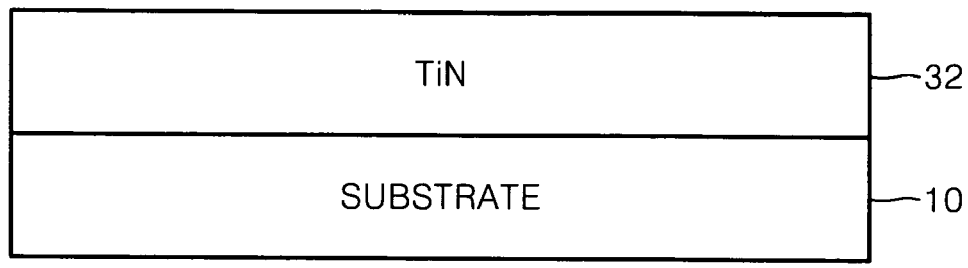
FIGS. 4A through 4C are cross-sectional views illustrating a method of manufacturing a ferroelectric thin film according to still another exemplary embodiment of the present invention.
Figure 4B:
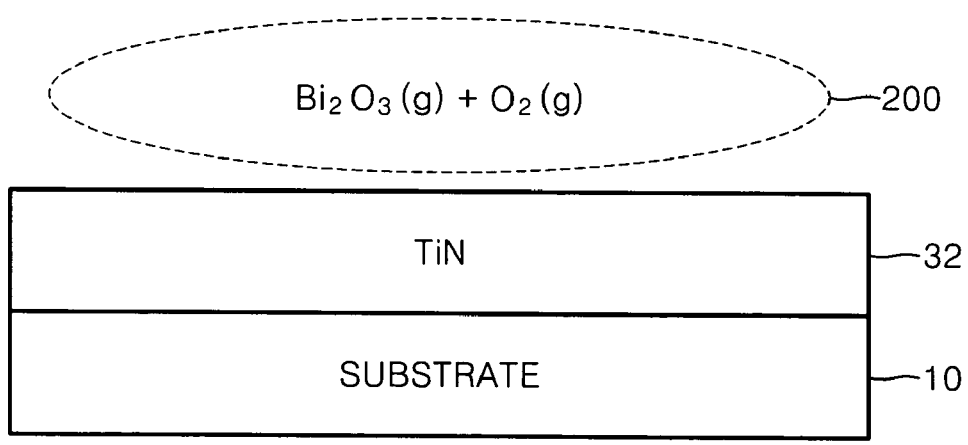
Figure 4C:
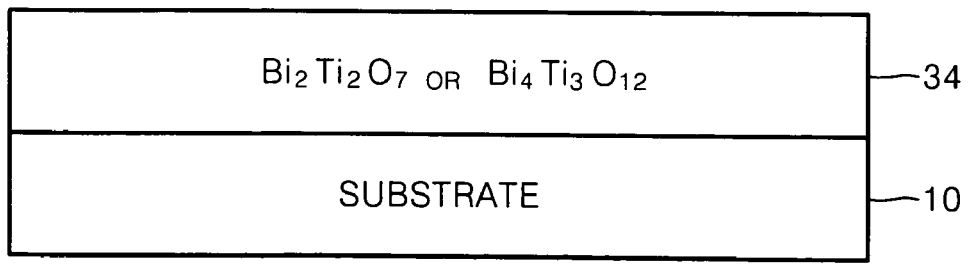

Referring to FIGS. 3B and 3C, a mixed gas atmosphere 100 containing PbO(g) and oxygen ($O_2$) is formed on the $Zr_xTi_{(1-x)}$N-based precursor layer 22. Next, the $Zr_xTi_{(1-x)}$N-based precursor layer 22 is annealed at a temperature of 400 to 800° C. in the mixed gas atmosphere 100 containing the PbO(g) and oxygen ($O_2$), thereby forming a ferroelectric thin film 24 containing $PbZr_xTi_{(1-x)}O_3$ (0<x<1). The formation of the $PbZr_xTi_{(1-x)}O_3$ thin film 24 may be expressed by:

(d) $2Zr_xTi_{(1-x)}N(s)+2O_2(g)+2PbO(g) \rightarrow 2PbZr_xTi_{(1-x)}O_3+N_2(g)$ The formation of the $PbZr_xTi_{(1-x)}O_3$ thin film 24 may be expressed by:

(e) $2Zr_xTi_{(1-x)}N(s)+2O_2(g) \rightarrow 2Zr_xTi_{(1-x)}O_2(s)+N_2(g)$ (f) $Zr_xTi_{(1-x)}O_2(s)+PbO(g) \rightarrow PbZr_xTi_{(1-x)}O_3(s)$ FIGS. 4A through 4C are cross-sectional views illustrating a method of manufacturing a ferroelectric thin film according to still another exemplary embodiment of the present invention.

Referring to FIG. 4A, a metal nitride-based precursor layer 32 containing TiN is formed on the substrate 10. The TiN-based precursor layer 32 can be formed in the same manner as in the exemplary embodiment of FIGS. 2A through 2C, and thus a detailed explanation thereof will be omitted.

Figure 5A:
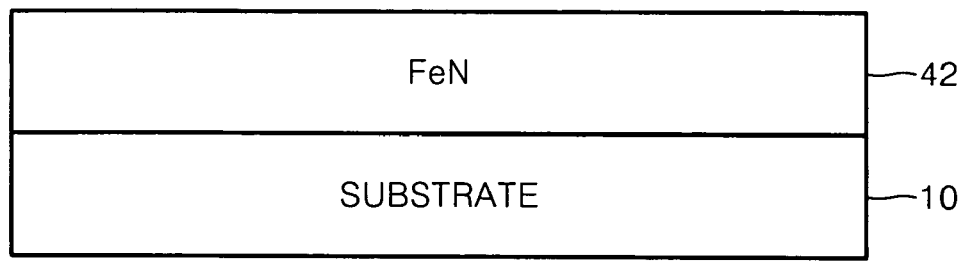
FIGS. 5A through 5C are cross-sectional views illustrating a method of manufacturing a ferroelectric thin film according to yet another exemplary embodiment of the present invention.
Figure 5B:
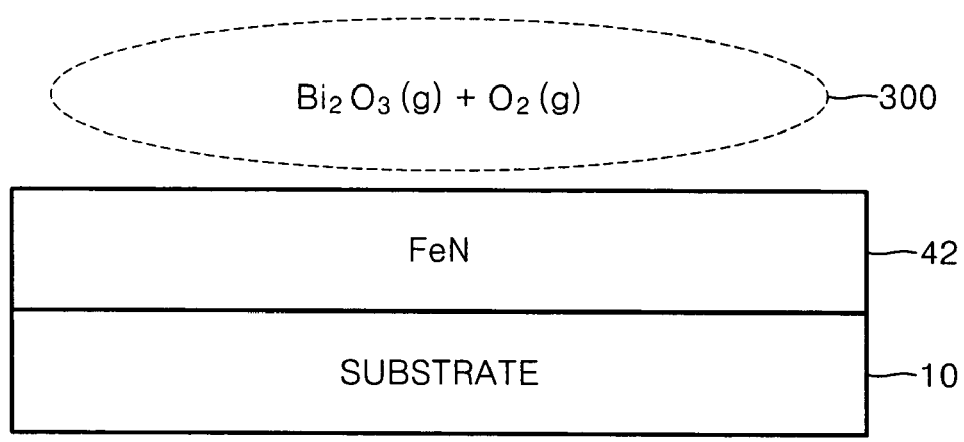
Figure 5C:
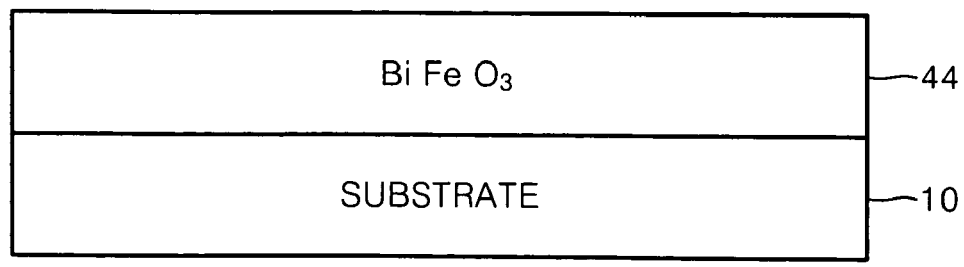

Referring to FIGS. 4B and 4C, a mixed gas atmosphere 200 containing $Bi_2O_3$(g) and oxygen ($O_2$) is formed on the TiN-based precursor layer 32. The mixed gas atmosphere 200 containing the $Bi_2O_3$(g) and oxygen ($O_2$) may be formed by thermal evaporation or sputtering. Next, the TiN-based precursor layer 32 is annealed at a temperature of 400 to 800° C. in the mixed gas atmosphere 200 containing the $Bi_2O_3$(g) and oxygen ($O_2$), thereby forming a ferroelectric thin film 34 containing $Bi_2Ti_2O_7$ or $Bi_4Ti_3O_{12}$. The formation of the $Bi_2Ti_2O_7$ thin film may be expressed by the following reaction scheme (g), and the formation of the $Bi_4Ti_3O_{12}$ thin film may be expressed by the following reaction scheme (h):

(g) $2TiN(s)+Bi_2O_3(g)+2O_2(g) \rightarrow Bi_2Ti_2O_7(s)+N_2(g)$ (h) $6TiN(s)+4Bi_2O_3(g)+6O_2(g) \rightarrow 2Bi_4Ti_3O_{12}(s)+3N_2(g)$ FIGS. 5A through 5C are cross-sectional views illustrating a method of manufacturing a ferroelectric thin film according to yet another exemplary embodiment of the present invention.

Referring to FIG. 5A, a metal nitride-based precursor layer 42 containing FeN is formed on the substrate 10. The FeN-based precursor layer 42 may be formed by vapor deposition such as sputtering, MOCVD, or PEMOCVD. The FeN-based precursor layer 42 of the present exemplary embodiment was formed by sputtering. A Fe target was used, and other sputtering conditions were the same as those in the exemplary embodiment of FIGS. 2A through 2C.

Referring to FIGS. 5B and 5C, a mixed gas atmosphere 300 containing $Bi_2O_3$(g) and oxygen ($O_2$) is formed on the FeN-based precursor layer 42. Next, the FeN-based precursor layer 42 is annealed at a temperature of 400 to 800° C. in the mixed gas atmosphere 300 containing the $Bi_2O_3$(g) and oxygen ($O_2$), thereby forming a ferroelectric thin film 44 containing $BiFeO_3$. The formation of the $BiFeO_3$ thin film 44 may be expressed by:

(i) $4FeN(s)+2Bi_2O_3(g)+3O_2(g) \rightarrow 4BiFeO_3(s)+2N_2(g)$

Figure 6A:
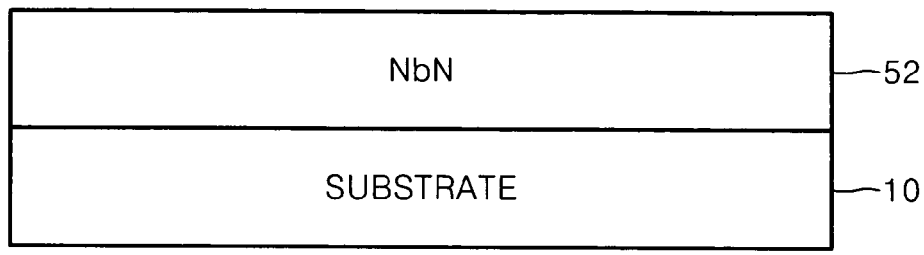
FIGS. 6A through 6C are cross-sectional views illustrating a method of manufacturing a ferroelectric thin film according to further another exemplary embodiment of the present invention.
Figure 6B:
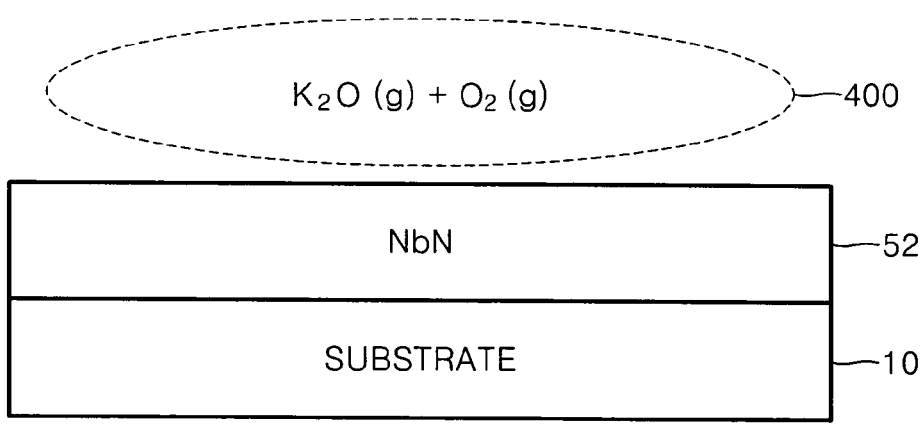
Figure 6C:
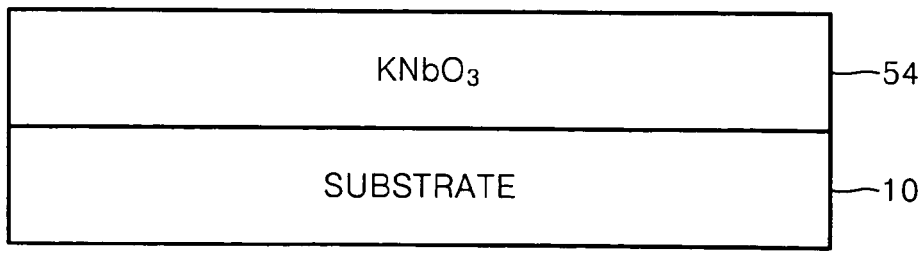

FIGS. 6A through 6C are cross-sectional views illustrating a method of manufacturing a ferroelectric thin film according to further another exemplary embodiment of the present invention.

Referring to FIG. 6A, a metal nitride-based precursor layer 52 containing NbN is formed on the substrate 10, and may be formed by vapor deposition such as sputtering, MOCVD, or PEMOCVD. The NbN-based precursor layer 52 in the present exemplary embodiment was formed by sputtering. An Nb target was used, and other sputtering conditions were the same as those in the exemplary embodiment of FIGS. 2A through 2C.

Referring to FIGS. 6B and 6C, a mixed gas atmosphere 400 containing $K_2O$(g) gas and oxygen ($O_2$) is formed on the NbN-based precursor layer 52. Next, the NbN-based precursor layer 52 is annealed at a temperature of 400 to 800° C. in the mixed gas atmosphere 400 containing the $K_2O$(g) and oxygen ($O_2$), thereby forming a ferroelectric thin film 54 containing $KNbO_3$. The formation of the $KNbO_3$ thin film 54 may be expressed by:

(j) $4NbN(s)+2K_2O(g)+5O_2(g) \rightarrow 4KNbO_3(s)+2N_2(g)$

The formation of the $KNbO_3$ thin film 54 may be expressed by:

(k) $2K_2O(g)+O_2(g) \rightarrow 2K_2O_2(g)$ (l) $4NbN(s)+2K_2O_2(g)+4O_2(g) \rightarrow 4KNbO_3(s)+2N_2(g)$ The exemplary embodiments illustrated in FIGS. 2A through 6C may be used in a method of manufacturing a ferroelectric recording medium.

FIGS. 7A through 7D are cross-sectional views illustrating a method of manufacturing a ferroelectric recording medium according to an exemplary embodiment of the present invention. The exemplary embodiments of FIGS. 2A through 6C describing the method of manufacturing the ferroelectric thin film can be referred to herein below.

Figure 7A:
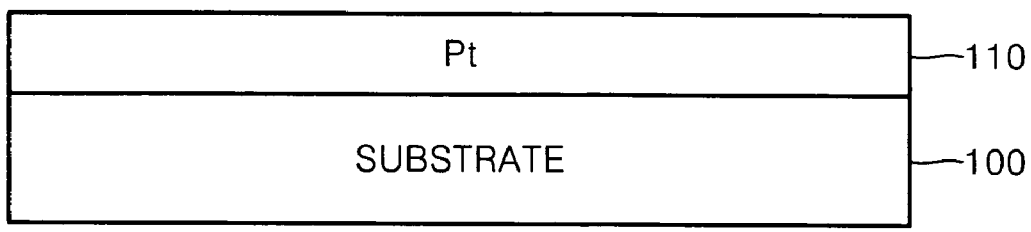
FIGS. 7A through 7D are cross-sectional views illustrating a method of manufacturing a ferroelectric recording medium according to an exemplary embodiment of the present invention.
Figure 7B:
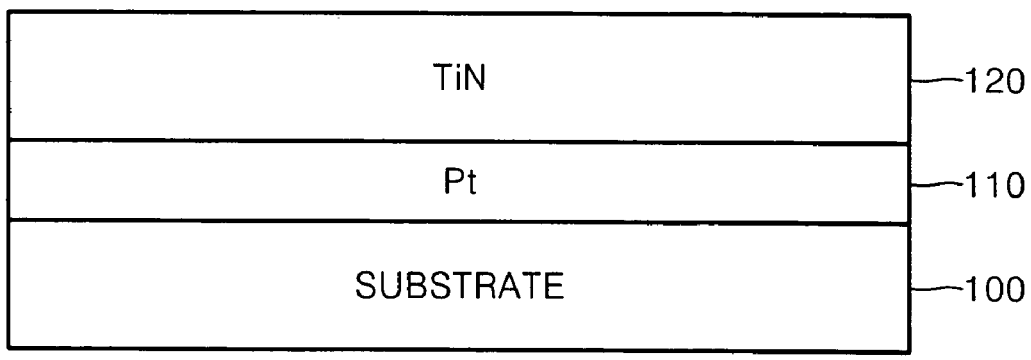

Referring to FIGS. 7A and 7B, an electrode layer 110 made of a conductive material such as Pt or Ir is formed on a substrate 100. The electrode layer 110 may be produced by vapor deposition such as sputtering, MOCVD, or PEMOCVD. A metal nitride-based precursor layer 120 containing one selected from the group consisting of TiN, $Zr_xTi_{(1-x)}$N (0<x<1), FeN, and NbN is formed on the electrode layer 110.

Figure 7C:
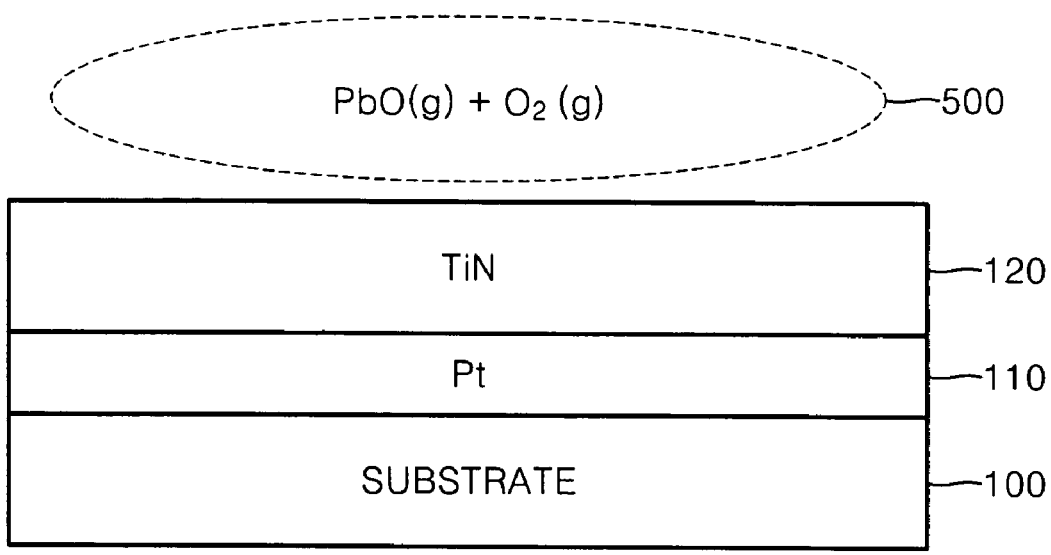
Figure 7D:
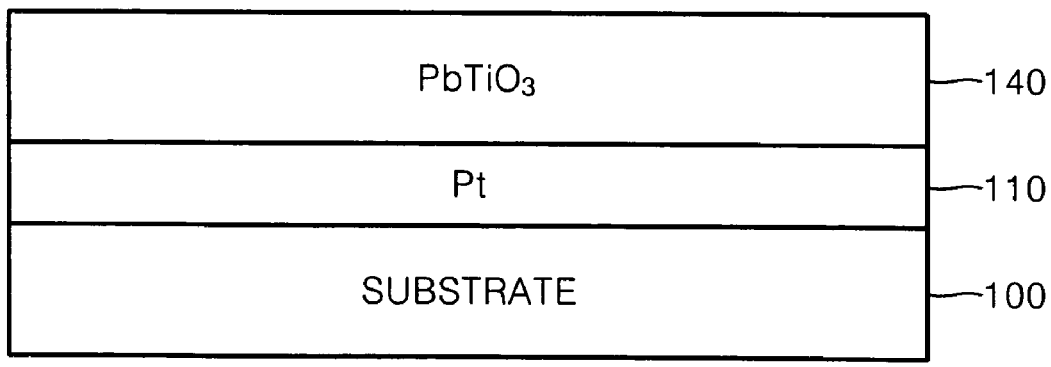

Referring to FIGS. 7C and 7D, a mixed gas atmosphere 500 containing oxygen ($O_2$) and one reactive gas selected from the group consisting of PbO(g), $Bi_2O_3$(g), and $K_2O$(g) is formed on the metal nitride-based precursor layer 120. Next, the metal nitride-based precursor layer 120 is annealed in the mixed gas atmosphere 500 to form a ferroelectric thin film 140 containing one selected from the group consisting of $PbTiO_3$, $PbZr_xTi_{(1-x)}O_3$ (0<x<1), $Bi_2Ti_2O_7$, $Bi_4Ti_3O_{12}$, $BiFeO_3$, and $KNbO_3$.

Figure 8A:
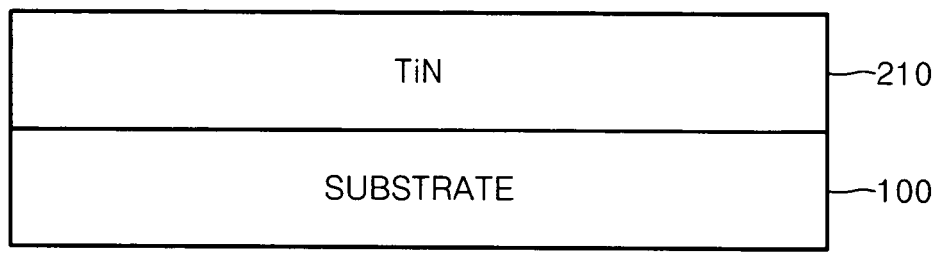
FIGS. 8A through 8C are cross-sectional views illustrating a method of manufacturing a ferroelectric recording medium according to another exemplary embodiment of the present invention.
Figure 8B:
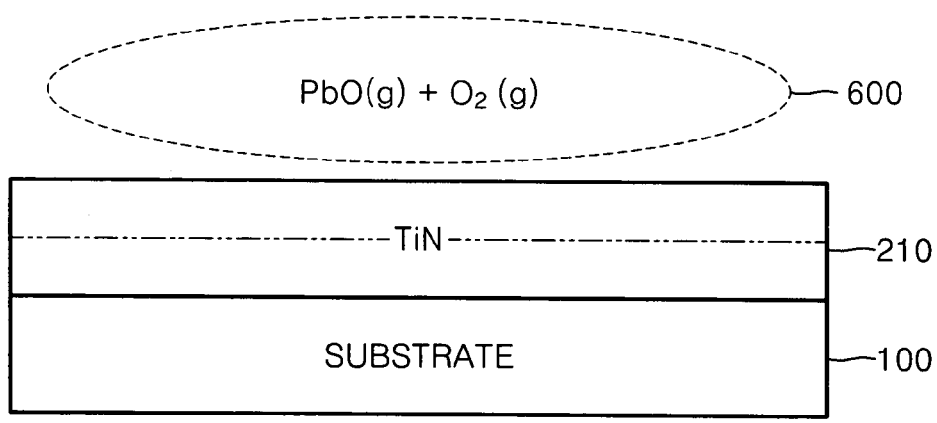
Figure 8C:
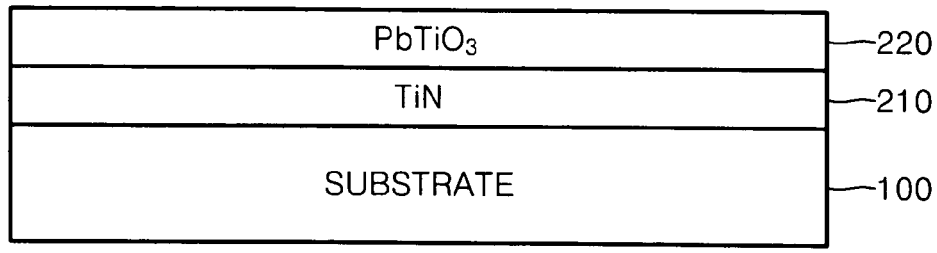

FIGS. 8A through 8C are cross-sectional views illustrating a method of manufacturing a ferroelectric recording medium according to another exemplary embodiment of the present invention.

Referring to FIG. 8A, a metal nitride-based precursor layer 210 containing one selected from the group consisting of TiN, $Zr_xTi_{(1-x)}$N (0<x<1), FeN, and NbN is formed on the substrate 100.

Referring to FIGS. 8B and 8C, a mixed gas atmosphere 600 containing oxygen ($O_2$) and one reactive gas selected from the group consisting of PbO(g), $Bi_2O_3$(g), and $K_2O$(g) is formed on the metal nitride-based precursor layer 210. Next, the metal nitride-based precursor layer 210 is annealed in the mixed gas atmosphere 600 such that only a surface layer of the annealed metal nitride-based precursor layer 210 reacts with the mixed gas atmosphere 600. As a result, only the surface layer with a predetermined thickness in the metal nitride-based precursor layer 210 is transformed into a ferroelectric thin film 220 containing one selected from the group consisting of $PbTiO_3$, $PbZr_xTi_{(1-x)}O_3$ (0<x<1), $Bi_2Ti_2O_7$, $Bi_4Ti_3O_{12}$, $BiFeO_3$, and $KNbO_3$, and the remaining metal nitride-based precursor layer 210 exists under the ferroelectric thin film 220. Since the remaining metal nitride-based precursor layer 210 allows current to flow through, the remaining metal nitride-based precursor layer 210 can act as an electrode layer. Hence, the method of manufacturing the ferroelectric recording medium according to the present exemplary embodiment can omit a process of forming an electrode layer.

As described above, using the method of the present invention, a ferroelectric thin film with good crystallinity and improved surface roughness can be obtained, and also a ferroelectric thin film with a predetermined stoichiometric composition can be easily manufactured. In addition, a ferroelectric recording medium having improved recording characteristics can be manufactured using the ferroelectric thin film manufacturing method.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a ferroelectric thin film, the method comprising:
    forming on a substrate a metal nitride-based precursor layer containing one selected from the group consisting of TiN, $Zr_xTi_{(1-x)}N$ (0<x<1), FeN, and NbN;
    forming on the metal nitride-based precursor layer a mixed gas atmosphere containing oxygen ($O_2$) and one reactive gas selected from the group consisting of PbO(g), $Bi_2O_3$(g), and $K_2O$(g); and
    annealing the metal nitride-based precursor layer in the mixed gas atmosphere and forming a ferroelectric thin film containing one selected from the group consisting of $PbTiO_3$, $PbZr_2Ti_{(1-x)}O_3$ (0<x<1), $Bi_2Ti_2O_7$, $Bi_4Ti_3O_{12}$, $BiFeO_3$, and $KNbO_3$.

2. The method of claim 1, wherein the forming of the metal nitride-based precursor layer comprises doping the metal nitride-based precursor layer with at least one element selected from the group consisting of Zr, Nb, and V.

3. The method of claim 1, wherein the metal nitride-based precursor layer is formed to a thickness of 2 μm or less.

4. The method of claim 1, wherein the metal nitride-based precursor layer is annealed at a temperature of 400 to 800° C.

5. The method of claim 4, wherein the metal nitride-based precursor layer is annealed at a temperature of 400 to 650° C.

6. The method of claim 1, wherein the mixed gas atmosphere is formed by thermal evaporation or sputtering.

7. The method of claim 1, wherein the forming of the ferroelectric tin film satisfies:

$$2TiN(s)+2O_2(g)+2PbO(g) \rightarrow 2PbTiO_3(s)+N_2(g).$$

8. The method of claim 1, wherein the forming of the ferroelectric thin film satisfies:

$$2TiN(s)+2O_2(g) \rightarrow 2TiO_2(s)+N_2(g)$$

$$TiO_2(s)+PbO(g) \rightarrow PbTiO_3(s).$$

9. The method of claim 1, wherein the forming of the ferroelectric thin film satisfies:

$$2Zr_xTi_{(1-x)}N(s)+2O_2(g)+2PbO(g) \rightarrow 2PbZr_xTi_{(1-x)}O_3+N_2(g).$$

10. The method of claim 1, wherein the forming of the ferroelectric thin film satisfies:

$$2Zr_xTi_{(1-x)}N(s)+2O_2(g) \rightarrow 2Zr_xTi_{(1-x)}O_2(s)+N_2(g)$$

$$Zr_xTi_{(1-x)}O_2(s)+PbO(g) \rightarrow PbZr_xTi_{(1-x)}O_3(s).$$

11. The method of claim 1, wherein the forming of the ferroelectric thin film satisfies:

$$2TiN(s)+Bi_2O_3(g)+2O_2(g) \rightarrow Bi_2Ti_2O_7(s)+N_2(g).$$

12. The method of claim 1, wherein the forming of the ferroelectric thin film satisfies:

$$6TiN(s)+4Bi_2O_3(g)+6O_2(g) \rightarrow 2Bi_4Ti_3O_{12}(s)+3N_2(g).$$

13. The method of claim 1, wherein the forming of the ferroelectric thin film satisfies:

$$4FeN(s)+2Bi_2O_3(g)+3O_2(g) \rightarrow 4BiFeO_3(s)+2N_2(g).$$

14. The method of claim 1, wherein the forming of the ferroelectric thin film satisfies:

$$4NbN(s)+2K_2O(g)+5O_2(g) \rightarrow 4KNbO_3(s)+2N_2(g).$$

15. The method of claim 1, wherein the forming of the ferroelectric thin film satisfies:

$$2K_2O(g)+O_2(g) \rightarrow 2K_2O_2(g)$$

$$4NbN(s)+2K_2O_2(g)+4O_2(g) \rightarrow 4KNbO_3(s)+2N_2(g).$$

16. A ferroelectric thin film manufactured by the method of claim 1.

17. A method of manufacturing a ferroelectric recording medium, the method comprising:
    forming a conductive electrode layer on a substrate;
    forming on the electrode layer a metal nitride-based precursor layer containing one selected from the group consisting of TiN, $Zr_xTi_{(1-x)}N$ (0<x<1), FeN, and NbN;
    forming on the metal nitride-based precursor layer a mixed gas atmosphere containing oxygen ($O_2$) and one reactive gas selected from the group consisting of PbO(g), $Bi_2O_3$(g), and $K_2O$(g); and
    annealing the metal nitride-based precursor layer in the mixed gas atmosphere and forming a ferroelectric thin film containing one selected from the group consisting of $PbTiO_3$, $PbZr_zTi_{(1-x)}O_3$ (0<x<1), $Bi_2Ti_2O_7$, $Bi_4Ti_3O_{12}$, $BiFeO_3$, and $KNbO_3$.

18. A ferroelectric recording medium manufactured by the method of claim 17.

19. A method of manufacturing a ferroelectric recording medium, the method comprising:
    forming on a substrate a metal nitride-based precursor layer containing one selected from the group consisting of TiN, $Zr_xTi_{(1-x)}N$ (0<x<1), FeN, and NbN;
    forming on the metal nitride-based precursor layer a mixed gas atmosphere containing oxygen ($O_2$) and one reactive gas selected from the group consisting of PbO(g), $Bi_2O_3$(g), and $K_2O$(g); and annealing the metal nitride-based precursor layer in the mixed gas atmosphere and forming on a surface layer of the annealed metal nitride-based precursor layer a ferroelectric thin film containing one selected from the group consisting of $PbTiO_3$, $PbZr_xTi_{(1-x)}O_3$ ($0<x<1$), $Bi_2Ti_2O_7$, $Bi_4Ti_3O_{12}$, $BiFeO_3$, and $KNbO_3$.

20. A ferroelectric recording medium manufactured by the method of claim 19.

21. A method of manufacturing a ferroelectric thin film, the method comprising:

forming a precursor layer on a substrate;

forming on the precursor layer a mixed gas atmosphere and one reactive gas; and annealing the precursor layer in the mixed gas atmosphere to form a ferroelectric thin film, wherein a metal nitride-based precursor layer containing a metal nitride selected from the group consisting of TiN, $Zr_xTi_{(1-x)}N$ ($0<x<1$), FeN, and NbN is formed on the substrate.

22. The method of claim 21, wherein a mixed gas atmosphere containing oxygen ($O_2$) and one reactive gas selected from the group consisting of $PbO(g)$, $Bi_2O_3(g)$, and $K_2O(g)$ is formed on the precursor layer.

23. The method of claim 22, wherein the metal nitride-based precursor layer is annealed in the mixed gas atmosphere and a ferroelectric thin film containing one selected from the group consisting of $PbTiO_3$, $PbZr_xTi_{(1-x)}O_3$ ($0<x<1$), $Bi_2Ti_2O_7$, $Bi_4Ti_3O_{12}$, $BiFeO_3$, and $KNbO_3$ is formed.

* * * * *